US006745140B2

(12) United States Patent
Sutton (10) Patent No.: US 6,745,140 B2
(45) Date of Patent: Jun. 1, 2004

(54) ELECTRONIC TEST SYSTEM WITH TEST RESULTS VIEW FILTER

(75) Inventor: Christopher K. Sutton, Everett, WA (US)

(73) Assignee: Agilent Technologies, Inc., Palo Alto, CA (US)

( * ) Notice: Subject to any disclaimer, the term of this patent is extended or adjusted under 35 U.S.C. 154(b) by 217 days.

(21) Appl. No.: 09/999,805

(22) Filed: Oct. 23, 2001

(65) Prior Publication Data

US 2003/0078747 A1 Apr. 24, 2003

(51) Int. Cl.[7] .......................... G06F 19/00; G01R 13/02
(52) U.S. Cl. ........................ 702/67; 702/84; 702/182; 345/821
(58) Field of Search ...................... 702/67, 68, 117, 702/118, 182, 81, 82, 83, 84; 700/121; 345/804, 788, 821

(56) References Cited

U.S. PATENT DOCUMENTS

| | | | | | |
|---|---|---|---|---|---|
| 5,631,825 | A | * | 5/1997 | van Weele et al. | 700/83 |
| 5,808,920 | A | * | 9/1998 | Zwan et al. | 702/120 |
| 5,894,311 | A | * | 4/1999 | Jackson | 345/440 |
| 5,910,895 | A | * | 6/1999 | Proskauer et al. | 700/121 |
| 6,026,397 | A | * | 2/2000 | Sheppard | 707/5 |
| 6,128,759 | A | * | 10/2000 | Hansen | 714/738 |
| 6,281,650 | B1 | * | 8/2001 | Yutkowitz | 318/561 |
| 6,446,022 | B1 | * | 9/2002 | Coss et al. | 702/121 |
| 6,449,744 | B1 | * | 9/2002 | Hansen | 714/738 |
| 6,507,842 | B1 | * | 1/2003 | Grey et al. | 707/5 |
| 6,522,345 | B1 | * | 2/2003 | Alexander | 345/771 |
| 6,529,217 | B1 | * | 3/2003 | Maguire et al. | 345/769 |
| 6,556,223 | B1 | * | 4/2003 | Tran et al. | 345/804 |
| 6,587,108 | B1 | * | 7/2003 | Guerlain et al. | 345/440 |
| 6,587,744 | B1 | * | 7/2003 | Stoddard et al. | 700/121 |
| 6,597,381 | B1 | * | 7/2003 | Eskridge et al. | 345/804 |
| 2001/0019328 | A1 | * | 9/2001 | Schwuttke et al. | 345/440 |
| 2002/0178258 | A1 | * | 11/2002 | Hushing et al. | 709/224 |
| 2003/0001896 | A1 | * | 1/2003 | Johnson et al. | 345/771 |
| 2003/0058280 | A1 | * | 3/2003 | Molinari et al. | 345/771 |
| 2003/0069876 | A1 | * | 4/2003 | Richardson | 707/1 |

FOREIGN PATENT DOCUMENTS

WO  WO 99/47937  9/1999

OTHER PUBLICATIONS

National Instruments, "Test Stand–A Complete Test Executive Environment," National Instruments, p. 55–60 (Mar. 2000).

Microsoft Excel Version 5.OC, "Microsoft Excel Help, Topic: "AutoFilter Command"", 1985, XP002260396, whole document.

Teststand User Manual [online], Mar. 2001, Retrieved on Nov. 7, 2003. Retrieved from the Internet: <URL:http://www.ni.com/pdf/manuals/322016b.pdf>, p. 18–1 to p. 18–3, table 18–1. XP002260790.

* cited by examiner

Primary Examiner—Patrick Assouad (57) ABSTRACT

An electronic test system with a test results view filter that enables the user to filter the test results of a test program according to their particular datapoint value status. The test results view filter is preferably comprised of graphical elements representing a plurality of test results view filter option buttons grouped together in said test results view filter. Each test result view filter option button is capable of filtering an entire test program for their respective datapoint value status and displaying said filtered datapoint value status. The test results view filter option buttons are selected from the group consisting of: all datapoint value status, failed datapoint value status, marginal datapoint value status, and selected datapoint value status.

35 Claims, 10 Drawing Sheets

ELECTRONIC TEST SYSTEM WITH TEST RESULTS VIEW FILTER

BACKGROUND OF THE INVENTION

1. Field of the Invention

The present invention relates to electronic systems for performing automated tests of complex electronic, electromechanical and mechanical equipment and products. More particularly, the present invention relates to an electronic test system with a test results view filter that enables the user to effectively and efficiently select certain test results of an entire test.

2. Statement of the Problem

Complex electronic, electromechanical and mechanical products and equipment are generally tested using automated test systems. Such tests can include validation tests which run through the various operations that the device under test (DUT) is capable of and records whether each operation was performed properly; environmental tests which expose the DUT to various combinations of temperature, pressure, and humidity, and records the results; and production tests, etc. Generally, both the DUT and the systems providing the environmental and other constraints on the DUT are controlled electronically. In the last decade or so, computerized programs which are capable of controlling a variety of automated tests, referred to in the art as "test executive" programs, have been developed.

Test executive programs in the prior art include internal test executive programs developed by Agilent Technologies and TESTSTAND software developed by National Instruments Corporation, which is described as a ready-to-run test executive for organizing, controlling, and executing automated prototype, validation, or production test systems. The prior art Agilent Technologies programs did not use a graphical user interface (GUI), therefore limiting the ability of the program to display large amounts of data in a simple fashion. The TESTSTAND software, while using a GUI, requires the user to scroll through multiple windows to determine the overall progress of a test. The TESTSTAND software showed the results in a spreadsheet that was not easy to analyze. The prior art software at best was limited to showing the results of a given measurement by colored test such as "passed" in blue color, "skipped" in yellow color and "failed" in red color. Therefore, it takes significant time to scan textual results to determine what further action is needed. When a test fails, it is usually necessary to examine the details of the test further to find the source of the failure before taking further action. Therefore, it would be highly desirable to have a test executive system in which test results are more easily selected and analyzed.

Tests usually are defined by a set of rules or specifications to which the DUT is compared. The rules or specifications generally comprise various inputs defined by electrical and mechanical parameters applied to the DUT, such as voltage, current, specified manipulations of controls and device parts, as well as environmental parameters under which the test is conducted, such as temperature, humidity, pressure, and the time period over which a parameter is applied. Each test will include many combinations of the parameters applied to each element of the DUT, and often will be repeated many times. Each combination of parameters will define a measurement that results in one or more datapoint values, which are recorded and compared to numerical or Boolean limits defining the specifications. Thus, as equipment and products become more complex, electronic test programs have become very long and complex, often requiring several days, or even a week or more to run a complete test.

In prior art test systems, the test results are displayed on a computer display screen as the test progresses, with the current test conditions and results, or a small portion of the conditions and results just prior to the current time, visible. If the user desires to see the test results which failed to meet a particular test specification limit, such as failed test results, the user scrolls through a display to see which individual test results in a test program failed to meet a particular test specification limit. This can be a lengthy, laborious and error prone means for determining which test results failed to meet a certain test specification limit.

If the user desires to see specific test results, such as failed or marginal test results, from earlier portions of the test, the user scrolls through a lengthy display of all test results manually seeking the desired test results. Because of the length and complexity of the test, it is not physically possible to display the entire report of a test on the screen at one time. At any given point in the scrolling, the user has only a partial view of the results, making it difficult for the user to view certain or particular test results without time consuming and tedious viewing and hand recording.

It would be highly desirable to have a test executive system in which the user could effectively and quickly filter the test results for viewing according to the user's interests and concern.

3. Solution to the Problem

The above and other problems are solved and an advance in the art is made by an electronic test program with interactive electronic displays in accordance with this invention. A first advantage of this invention is that it allows the user to filter the datapoint values of an entire test procedure by simply selecting a test results view filter option button in the test results view filter. A second advantage of this invention is that the output device displays only those datapoint values that are selectively filtered. A third advantage of this invention is that it allows the user to filter repeatedly and differently the results of a test procedure without having to rerun the procedure. A fourth advantage of this invention is that the datapoint values can be filtered while the test procedure is progressing or after the test procedure has been completed.

The test results view filter enables the user to filter an entire test report by selecting a particular test results view filter option button. This allows the user to save time by immediately selecting datapoint values of interest to the user, such as the datapoint values that failed test specification limits or those datapoint values that marginally met test specification limits. The user does not have to search through the whole listing of datapoint values to determine those datapoint values that failed test specification limits or those datapoint values that met marginal test specification limits.

The test results view filter enables the user to see just the filtered datapoint values. It displays only the filtered datapoint values of interest to the user, thereby leaving the display screen clear of any unwanted or uninteresting datapoint values. The user can effectively and efficiently view the datapoint values that are of interest to them. This alleviates the tedious and laborious task of viewing the entire test procedure display output searching for those datapoint values of interest to them. The user doesn't have to make notes or record values while scanning an entire test procedure output. The user need only select the test results view filter option button corresponding to the desired datapoint values of interest, and the invention displays just the filtered datapoint values.

The test results view filter enables the user to filter the same set of test procedure datapoint values repeatedly in different filter modes without having to rerun the test procedure. This allows the user to filter all test procedure datapoint values according to a user's first interest, and then filter subsequently all test procedure datapoint values according to the user's second interest. The test results view filter is capable of filtering over and over the same set of test procedure datapoint values.

The test results view filter enables the user to filter the datapoint values while the test procedure is running or after the test procedure has completed. The user can select the test results view filter option button corresponding to the datapoint values that the user is interested in prior to the execution of the test procedure and then start the test procedure and have the test results view filter display the selected datapoint values as the test is running, thereby displaying just the filtered datapoint values. The user can also filter the datapoint values according to the user's interest after the test procedure has completed.

The present invention is an application executed by a processing unit. One skilled in the art will recognize that instructions for the application may be stored in a memory as software instruction, and/or as firmware in a memory affixed to a processing chip. The application of this invention is executed in the following manner. In one embodiment, the user selects a test results view filter option button in the test results view filter corresponding to the datapoint values that the user is interested in viewing. The user starts the test procedure and the output device displays the filtered datapoint values. In another embodiment, the user starts the test procedure and the output device displays all datapoint values and then the user selects the test results view filter option button corresponding to the datapoint values of interest to the user and the output device displays the filtered datapoint values. In a preferred embodiment, the datapoint values are displayed in a dialog box.

The test results view filter option buttons are preferably selected from the group comprising: an all test results view filter option button, a marginal test results view filter option button, a failed test results view filter option button, and a selected test results view filter option button. In a preferred embodiment, the input is selected by the user "clicking" or selecting on a particular test results view filter option button representing the desired datapoint filter. For example, the user "clicks" or selects the all test results view filter option button and the output device displays all datapoint values performed by the test procedure.

The failed test results view filter option button filters and displays those datapoint values that are associated with a failed datapoint value status because they failed to meet a certain test specification limit. The marginal test results view filter option button filters and displays those datapoint values that are associated with a marginal datapoint value status because they marginally met a certain test specification limit. The all test results view filter option button displays all datapoint values. The selected test results view filter option button filters and displays a particular datapoint value or values.

A test procedure may store at least one test specification limit that is used to compare the datapoint values with which to determine the datapoint value status. For example, the user may wish to view all datapoint values over a certain test specification limit of a test procedure as a failed status, like all results over 1.1 volts. Here the invention will assign a passed datapoint value status to all datapoint values in a test procedure that are less than 1.1 volts. Correspondingly, the invention will associate all datapoint values that are equal to or exceed 1.1 volts with a failed datapoint value status. In addition, the user may wish to know what datapoint values marginally meet a certain test specification limit; for these datapoint values, the invention will associate a marginal datapoint value status.

The datapoint value status is associated to each datapoint value by comparing the datapoint value with at least one stored test specification limit. The invention is capable of storing at least one test specification for determining those datapoint values that fail a test procedure and at least one test specification for determining those datapoint values that marginally meet a test procedure.

The invention provides an electronic test system comprising: a memory for storing a test, a measurement, a datapoint, a datapoint value, and a datapoint value status associated with the datapoint value indicating whether the datapoint value is a passed, marginal, or failed datapoint value; an electronic processor communicating with the memory for controlling the execution of the test; an input device communicating with the electronic processor for selecting between at least two of the following groups of datapoint value statuses: all datapoint values, marginal datapoint values, failed datapoint values or a selected datapoint value; and an output device communicating with the electronic processor for displaying the selected datapoint value and the associated datapoint value status. Preferably, the memory further stores a test results view filter responsive to receiving from tile input device.

Preferably, the electronic test system provides an output device that further displays the test results view filter, and the test results view filter further comprises a plurality of test results view filter option buttons. Preferably, the electronic test system further includes the test results view option buttons which are selected from the group consisting of: all, marginal, fail and selected. Preferably, the electronic test system further includes a test results view option button capable of being highlighted or depressed when selected. Preferably, the electronic test system further includes the all test results view option button that displays to the output device all datapoint values and datapoint value status associated with all datapoint values. Preferably, the electronic test system further includes a marginal test results view option button that displays to the output device the marginal datapoint values and the datapoint value status associated with the marginal datapoint values; this view option may also include the failed datapoint values and value status. Preferably, the electronic test system further includes a failed test results view option button that displays to the output device the failed datapoint values and datapoint value status associated with the failed datapoint value.

Preferably, the electronic test system further comprises a test specification limit and the memory further stores the test specification limit. The preferred electronic test system comprises a test specification limit selected from the group comprised of an upper test specification limit and a lower test specification limit. The electronic test system preferably also provides for the datapoint value to be compared to a test specification limit and a resultant datapoint value status is associated to the datapoint value. The electronic test system, preferably, further includes an output device that further displays the test, the measurement, the datapoint, the datapoint value, the test specification limit, and the datapoint value status.

The present invention not only provides an electronic test program that displays the overall output in a form that can be observed in a glance, but also displays the output in a form which permits the user to quickly check individual results. Other features, objects and advantages of the invention will become apparent from the following description when read in conjunction with the accompanying drawings.

DETAILED DESCRIPTION OF THE PREFERRED EMBODIMENT

Figure 1:
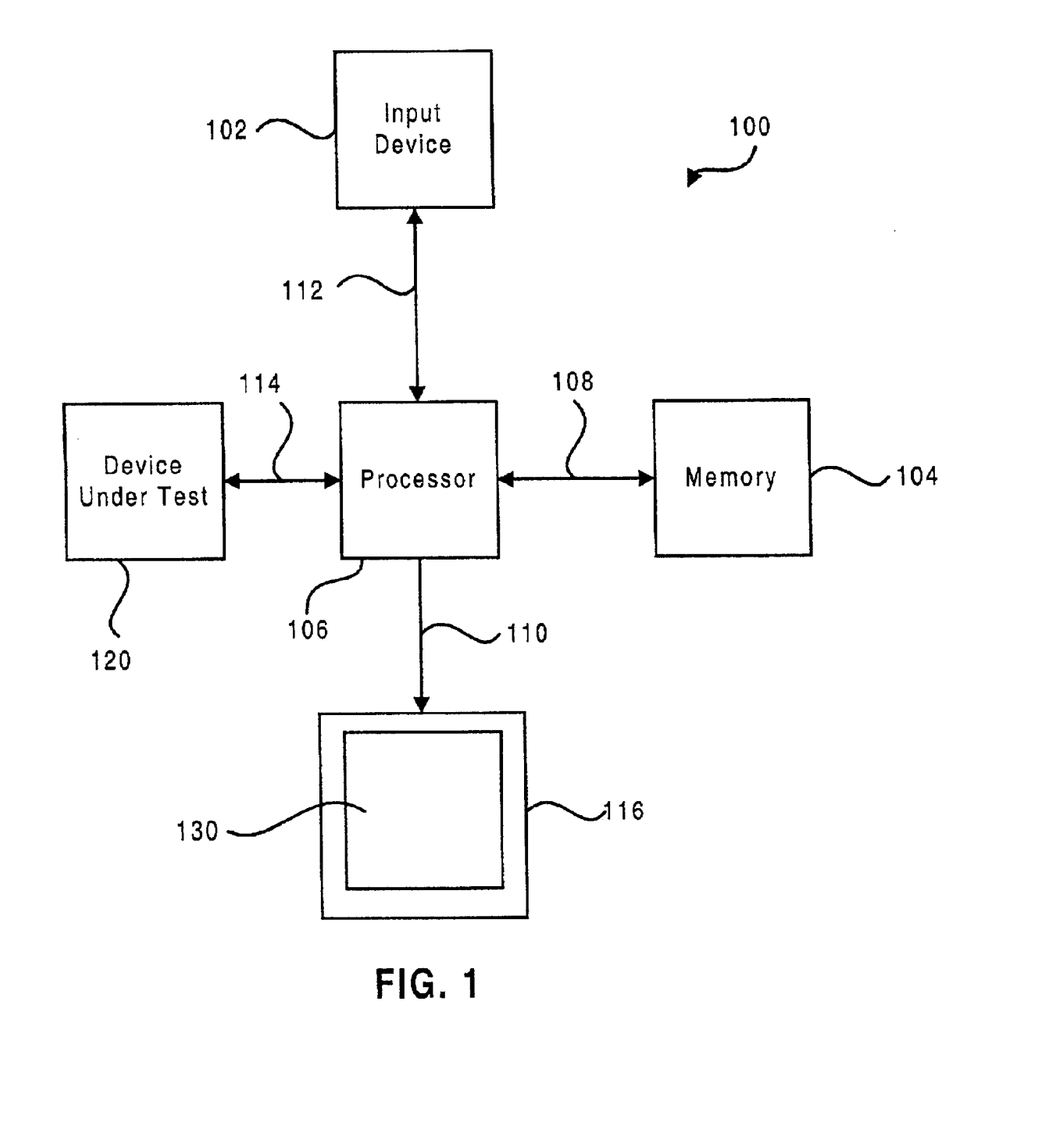
FIG. 1 is a block diagram showing the principal hardware components of the preferred embodiment of the present invention.

The present invention relates to an electronic test system with a test results view filter that enables the user to view all datapoint values and their associated datapoint value status or to filter datapoint values according to their respective datapoint value status. FIG. 1 is a block diagram illustrating a computer system 100 in which the present invention is implemented. Computer system 100 includes an input device 102, a memory 104, an output device 116, an electronic processor 106, and a device under test (DUT) 120. Memory 104 contains object oriented hierarchical software instructions which embody the method of the invention, and which will be described in detail below. Memory 104 may be a non-volatile memory such as a Read Only Memory (ROM) or a volatile memory such as a Random Access Memory (RAM).

In a preferred embodiment, the test executive program of this invention is stored as instructions in memory 101. Those skilled in the art will recognize that the instructions may either be stored as computer software and/or firmware that is readable and executable by electronic processor 102. The results for a test performed by the test executive program are displayed on output device 116. Output device 116 is a display and associated drivers that allow an application to display images to a user. Those skilled in the art will recognize that the display may be a conventional cathode ray monitor or Liquid Crystal Display (LCD), and that other output devices, such as a printer, may be used.

Figure 3:
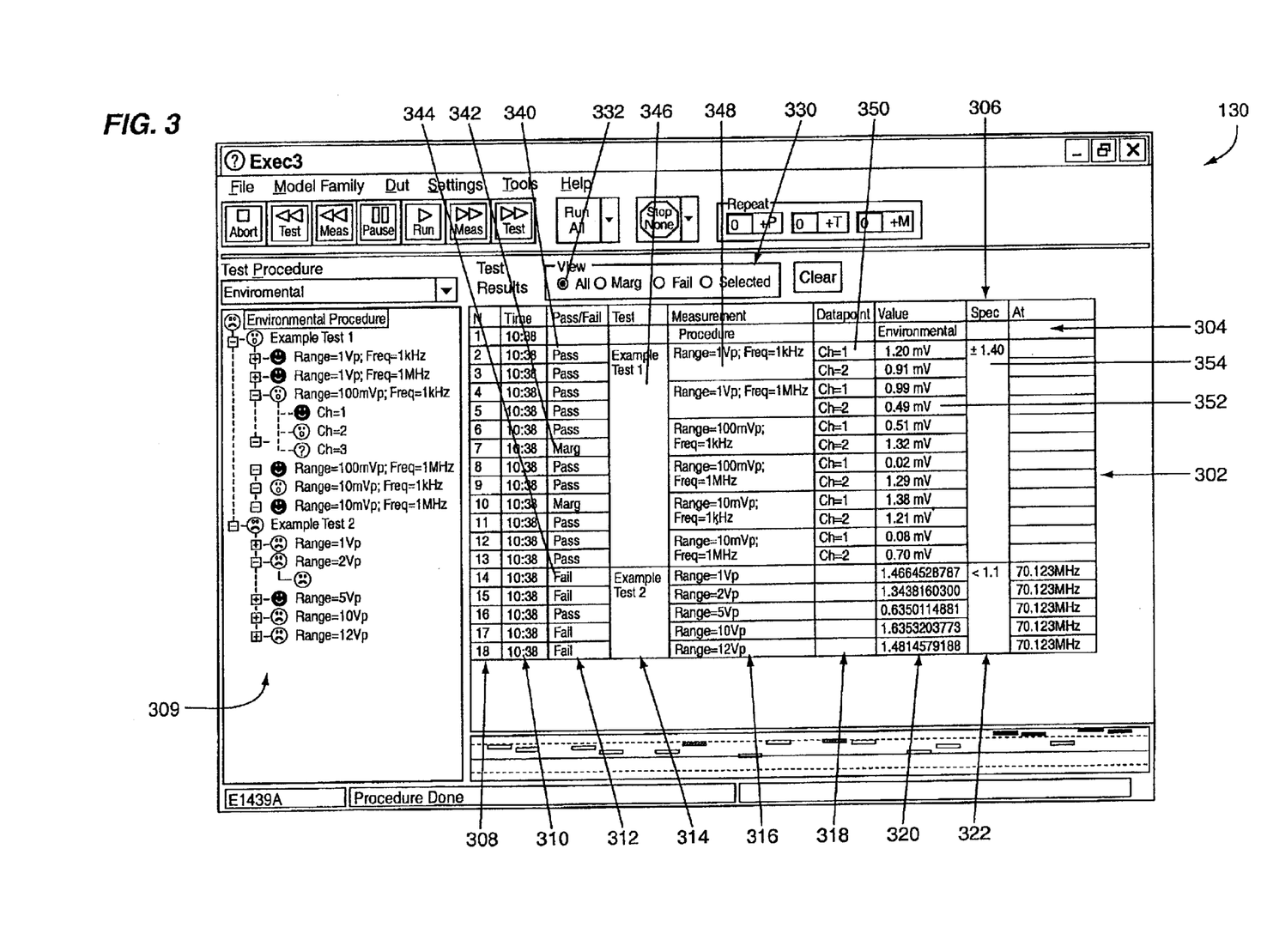
FIG. 3 is a view of the graphical user interface display of the electronic test system displaying the all test results view filter option button selection.

The electronic processor 106 executes the test executive program of this invention. The DUT 120 communicates with processor 106 over path 114. Processor 106 reads from and writes to memory 104 over path 108. Input device 102 sends input signals to processor 106 over path 112. Responsive to the signals from the DUT 120, and input device 102, and under control of an object oriented hierarchical software program stored in memory 104, processor 106 generates electronic information signals and sends the signals to an output device 116 over path 110 to visually display or audibly transmit information, in the form of datapoint values, in a graphical user interface format on screen 130, which is shown in FIG. 3 and will be discussed in detail below.

One skilled in the art will recognize that this invention may be implemented by any electronic device having the same general configuration outline in FIG. 1. These electronic devices include but are not limited to a computer system, logic circuits embedded in hardware, and an electronic analyzer.

Figure 2:
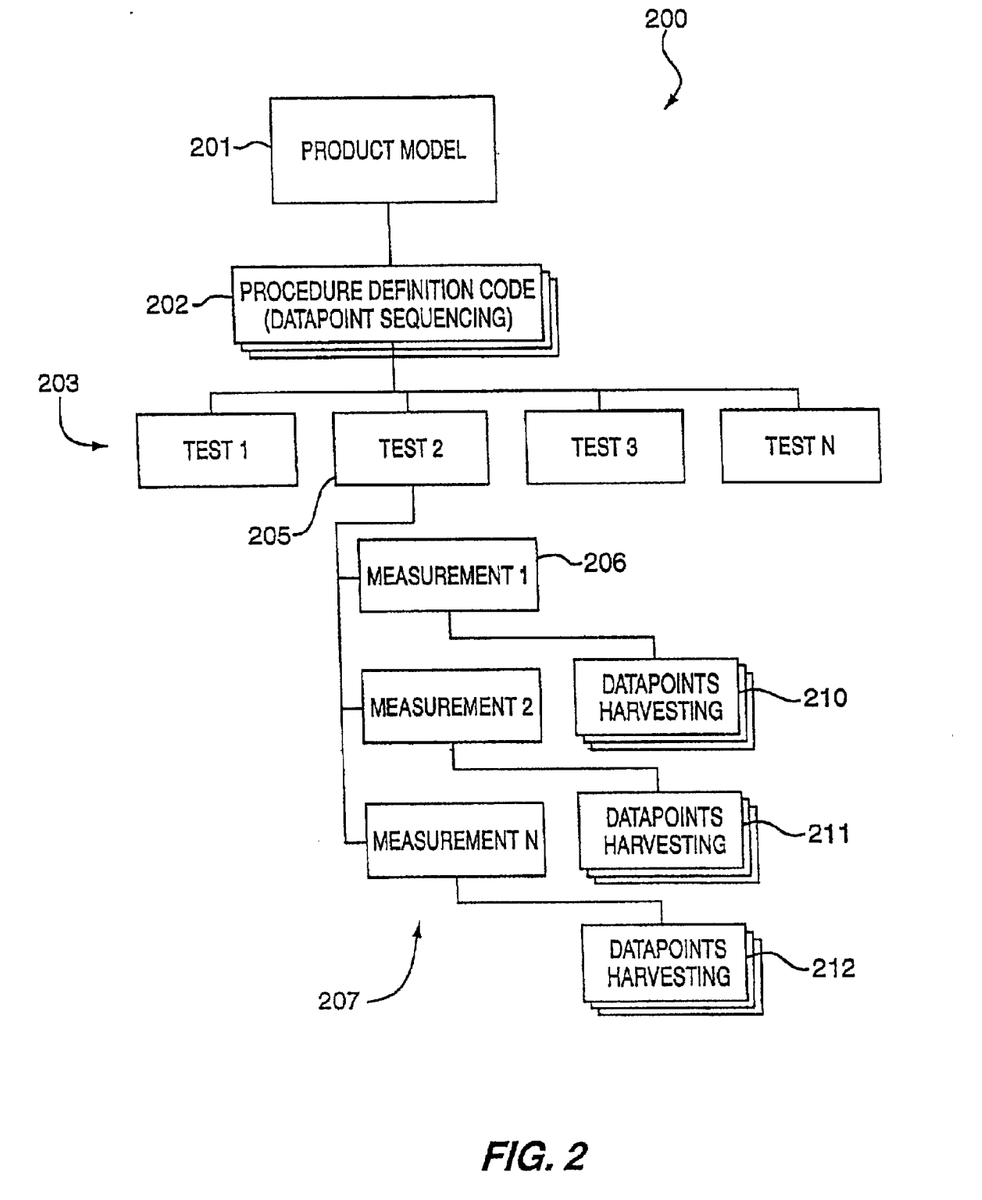
FIG. 2 is a block diagram showing the hierarchical structure of the preferred embodiment of a test program according to the invention.

To better understand the workings of the invention, it is helpful to describe the hierarchical structure of the preferred test program of the present invention, and the order in which the test is performed. Referring to FIG. 2, there is shown a block diagram 200 illustrating the hierarchical, i.e., multi-level, characteristic of the test program. The first level 201 corresponds to the product model, a file the test developer creates to test a family of specific device model numbers. It contains a group of procedures 202.

The next level 202 corresponds to the procedure itself. A procedure is an ordered list, sequence, or script of test to be run. Several procedures may exist, which are represented in FIG. 2 by a collection of procedures 202, each representing an individual procedure. Each procedure includes a plurality of tests, i.e., test 1, test 2, test 3 . . . test N, as shown at 203. Each test includes a plurality of measurements 206. This is illustrated in FIG. 2 for test 2 shown at 205. As shown, test 205 includes measurements 207, i.e., measurement 1, measurement 2 . . . measurement N. Each measurement includes one or more datapoints, represented as a deck of cards 210, 211, 212, associated with each measurement. A procedure is defined by writing a program or a code to build a structure of software objects. In one embodiment, the software objects are component object model (COM) objects. COM is a language independent component architecture, not a programming language. It is meant to be a general purpose, object-oriented means to encapsulate commonly used functions and services. See Newton's Telecom Dictionary by Harry Newton, Publishers Group West, page 197.

A test 205 is a group of measurements 207 in a procedure 202 that share the same test algorithm or the same test software code. Some examples of tests include amplitude accuracy test, test of harmonic distortion, etc. The test program repeatedly calls a test for each measurement and datapoint.

A measurement, such as measurement 206, is a configuration or a set up for a test. Each measurement, in measurements 207, within a test 205 can have different setups or configuration parameters. Tests are parameter driven and the parameters are inputs at the measurement level. Measurements are elements such as range in volts, frequency in kilohertz or harmonic (an integer number). The test procedure 202 views the measurements 207 as data to be passed from the procedure to a test. A measurement is also a phase of test execution. During the measurement phase of test execution, the measurement is started but data is not collected. This allows for multiple DUTs to be configured and triggered together.

A datapoint such as 210, 211, 212, is a subset of a measurement, such as 206, containing additional parameters that select a result when one measurement generates datapoint values. Some examples of multiple datapoints for a measurement are the minimum and maximum of a spectrum analyzer sweep or each channel of a device.

For each datapoint, such as 210, in measurement 206, a datapoint value is extracted. The datapoint values obtained are compared to test specification limits. Test specification limits are numerical limits, string match, or Boolean pass/fail.

All the inputs and outputs of the electronic test system (FIG. 1) are handled preferably through a graphical user interface (GUI). FIG. 3 shows the GUI 130 as displayed on the output device 116. The middle right portion of the screen 309 shows a window 302 describing the hierarchy of procedures, tests, measurements, and datapoints. The window 302 of the GUI 130 shows a series of rows, such as 304, and columns, such as 306, of alphanumeric test information.

Column 308 indicates the sequential number of each datapoint value 352. Column 310 indicates the time that a test 346 is executed. Column 312 displays the datapoint value status of the test. Column 314 displays the name of a test 346, such as Amplitude Accuracy. Column 316 displays the measurement 348 associated with each test 346, such as (Range=5 Vp, Frequency=1 KHz). Column 318 displays the datapoint 350 associated with each measurement 348, such as Ch=1 or Ch=2. Column 320 displays the datapoint value 352 for each test 346, such as 0.1235 dB. Column 322 displays the test specification limit 354, such as (<1.1), associated with each test 346.

The test results view filter 330 represents the user interface for a preferred embodiment of the invention. In FIG. 3, the all test results view filter option button 332 in the test results view filter 330 has been selected. When the all test results view filter option button 332 has been selected, all test results are displayed. Datapoint values 352 with a pass datapoint value status 340 are those datapoint values that do not exceed any test specification limits 354. Datapoint values 352 with a marginal datapoint value status 342 are those datapoint values 352 that exceed a marginal test specification limit 322. Datapoint values 352 with a failed datapoint value status 344 are those datapoint values 352 that exceed a failed test specification limit.

Figure 4:
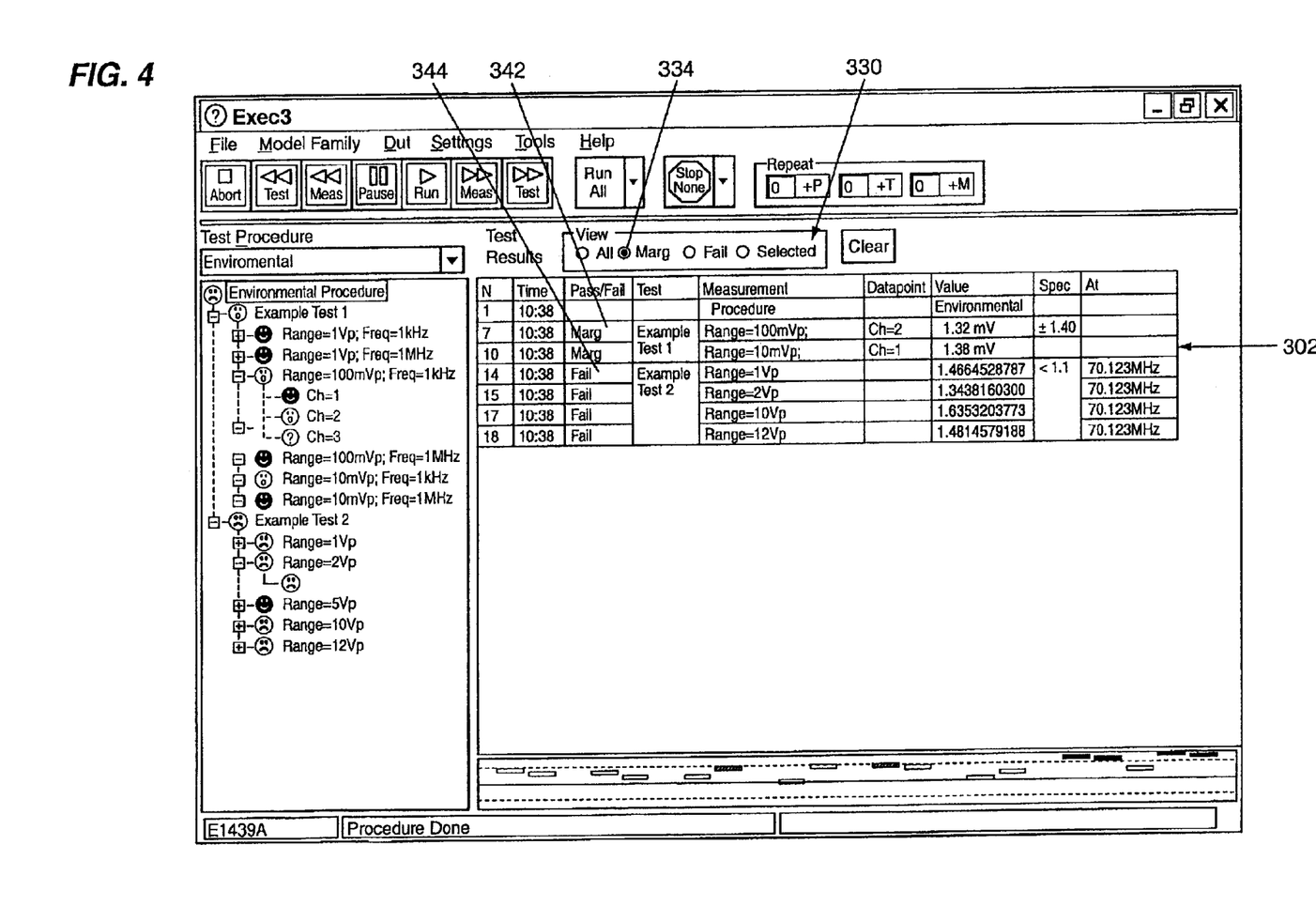
FIG. 4 is a view of the graphical user interface display of the electronic test system displaying the marginal test results view filter option button selection.

In FIG. 4, the marginal test results view filter option button 334 in the test results view filter 330 has been selected. When the marginal test results view filter option button 334 has been selected, column 312 displays only marginal datapoint value status 342 and failed datapoint value status 344.

Figure 5:
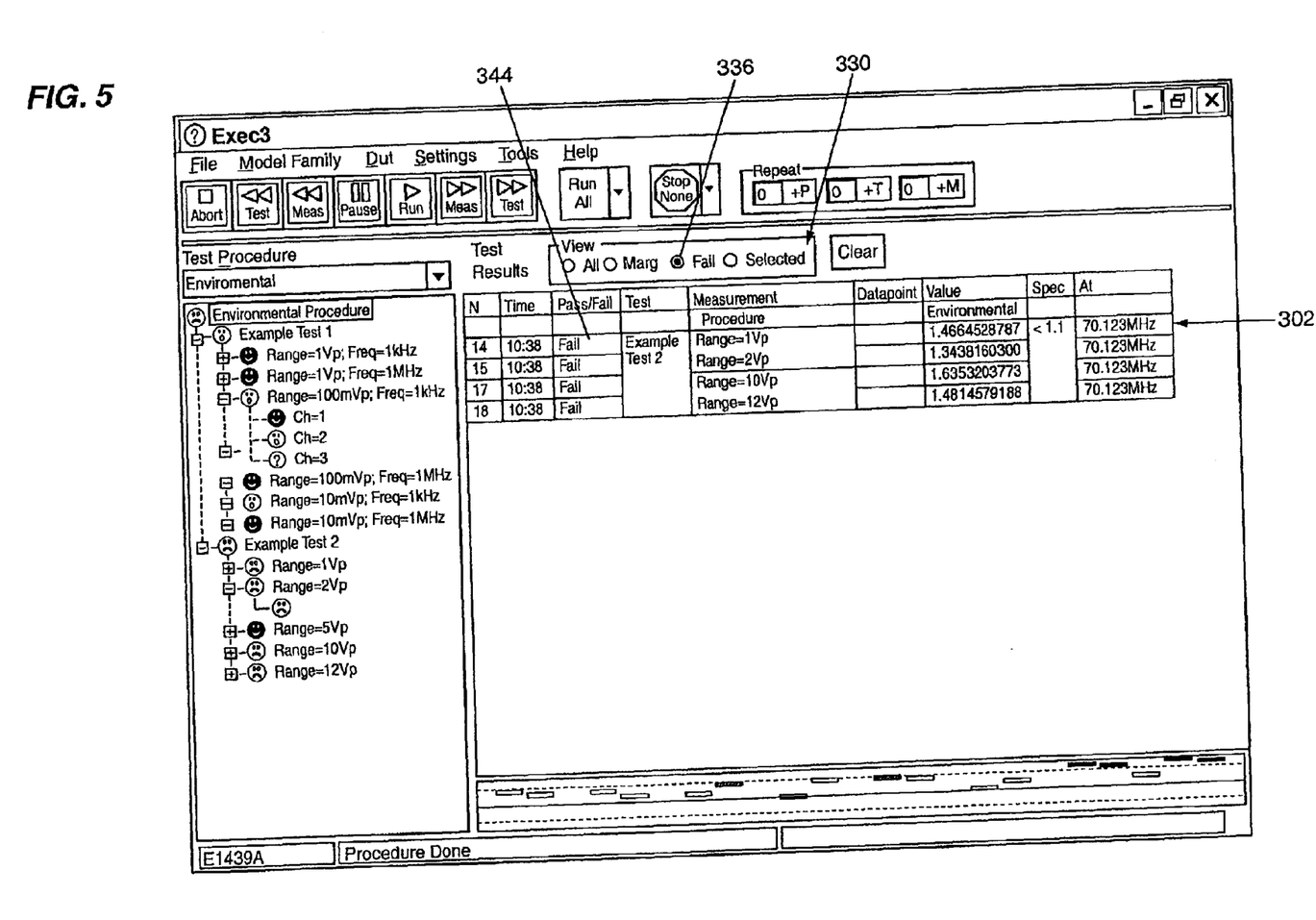
FIG. 5 is a view of the graphical user interface display of the electronic test system displaying the failed test results view filter option button selection.

In FIG. 5, the failed test results view filter option button 336 in the test results view filter 330 has been selected. When the failed test results view filter option button 336 has been selected, column 312 displays only failed datapoint value status 344.

Figure 6:
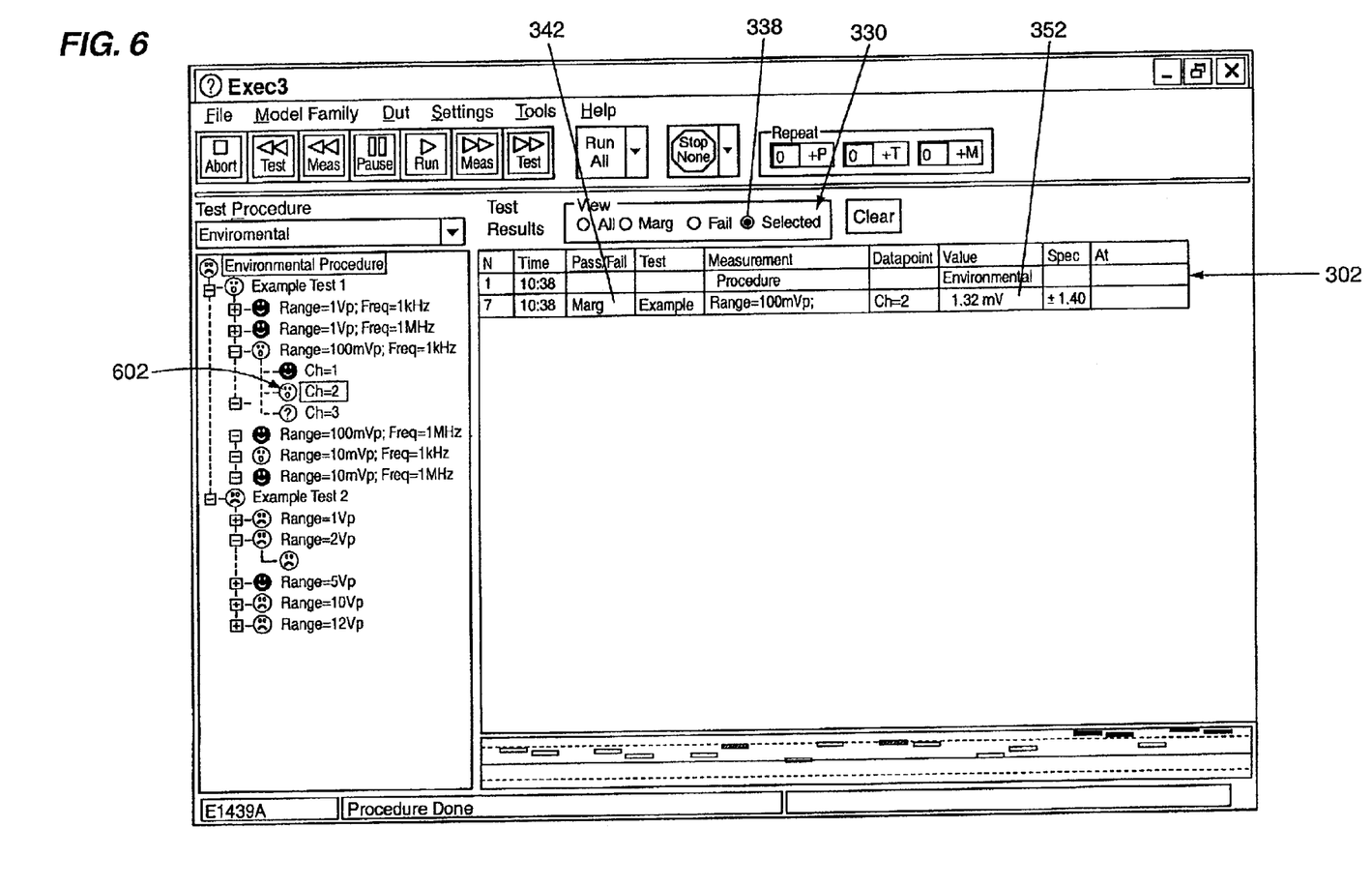
FIG. 6 is a view of the graphical user interface display of the electronic test system displaying the selected test results view filter option button selection.

In FIG. 6, the selected test results view filter option button 338 in the test results view filter 330 has been selected. When the selected test results view filter option button 338 has been selected, column 312 displays only a selected datapoint value 602 and associated datapoint value status 342. The user selects a certain datapoint 602 and the window 302 displays only that selected datapoint 602. In FIG. 6, the Ch=2 datapoint of the Range=100 mVp measurement has been selected.

Figure 7:
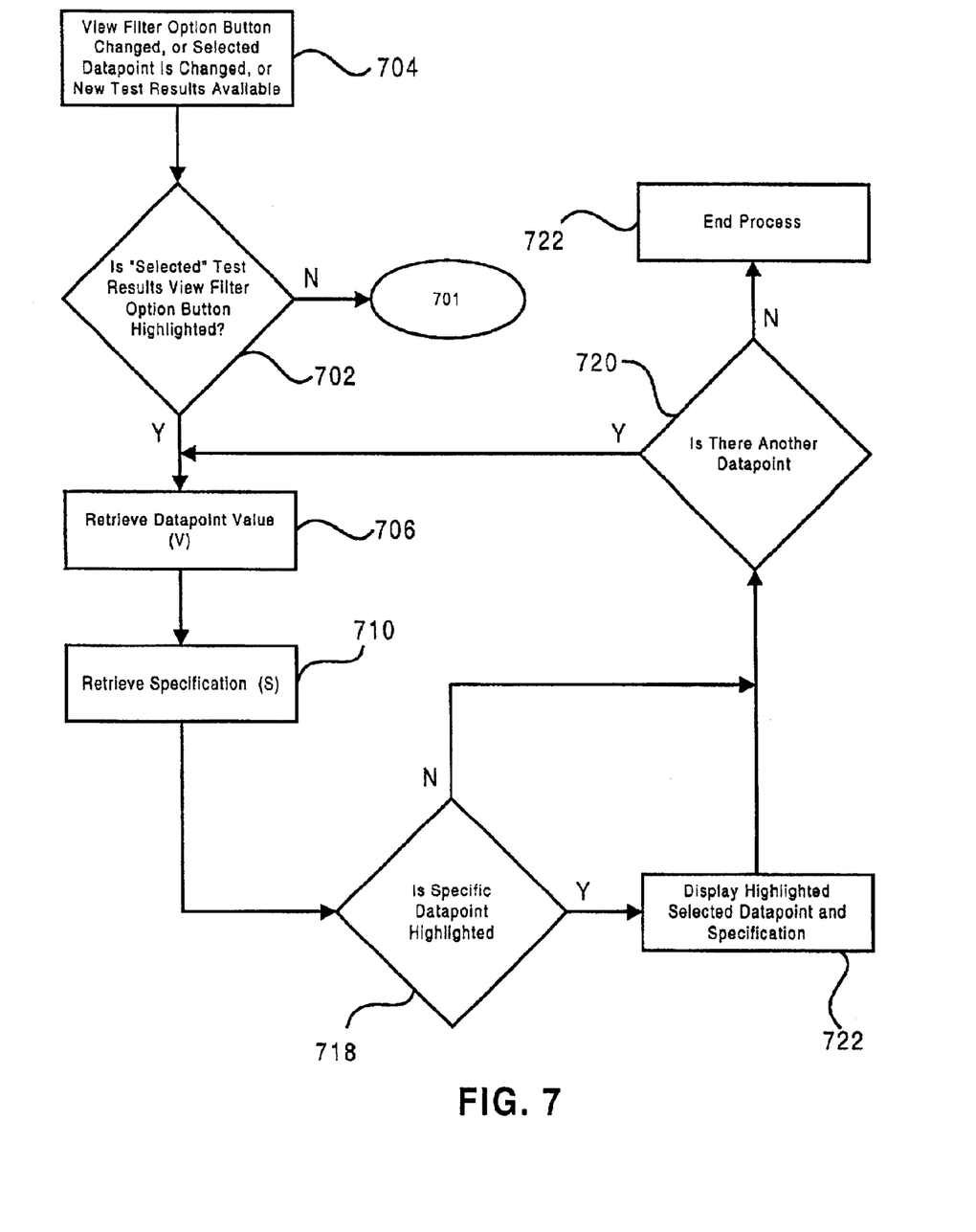
FIG. 7 is a flow diagram illustrating the determination of the selected test results view filter.

The following FIGS. 7–10 are flow diagrams of the steps executed by the test executive program in order to filter and display the test results according to the invention. FIG. 7 illustrates a flow diagram of a process executed by a test executive program to filter and display a test result according to the invention. One skilled in the art will recognize that the steps shown in the flow diagrams of FIGS. 7–10 can be programmed in any number of programming languages including C, C++, SQL, Visual Basic, or other languages that provide the functionality needed.

FIG. 7 illustrates a flow diagram of the filtering and displaying process of the selected test results view filter. This process is invoked when the view filter option button is changed, when the selected datapoint is changed, or when new test results become available. Step 704 is the initiation of this process. Step 702 is an initial inquiry into whether the selected test results view filter option button 338 is selected in the test results view filter 330. If the selected test results view filter option button 338 is selected, then the test executive program will filter and display the selected datapoint 602, datapoint value 352 and associated datapoint value status 342. The test executive program retrieves 706 the datapoint value 352. Then step 710 retrieves the test specification limit 354. The test executive program then analyzes each datapoint 350 in the test procedure 202. Then step 718 queries whether in fact a specific datapoint is selected in screen 309. If a specific datapoint has been selected, then only the row displaying 722 the selected datapoint value 352 is displayed. Step 720 repeats the process for all datapoints. If the answer to the initial query of step 702 is no, then the test executive system proceeds to step 701.

Figure 8:
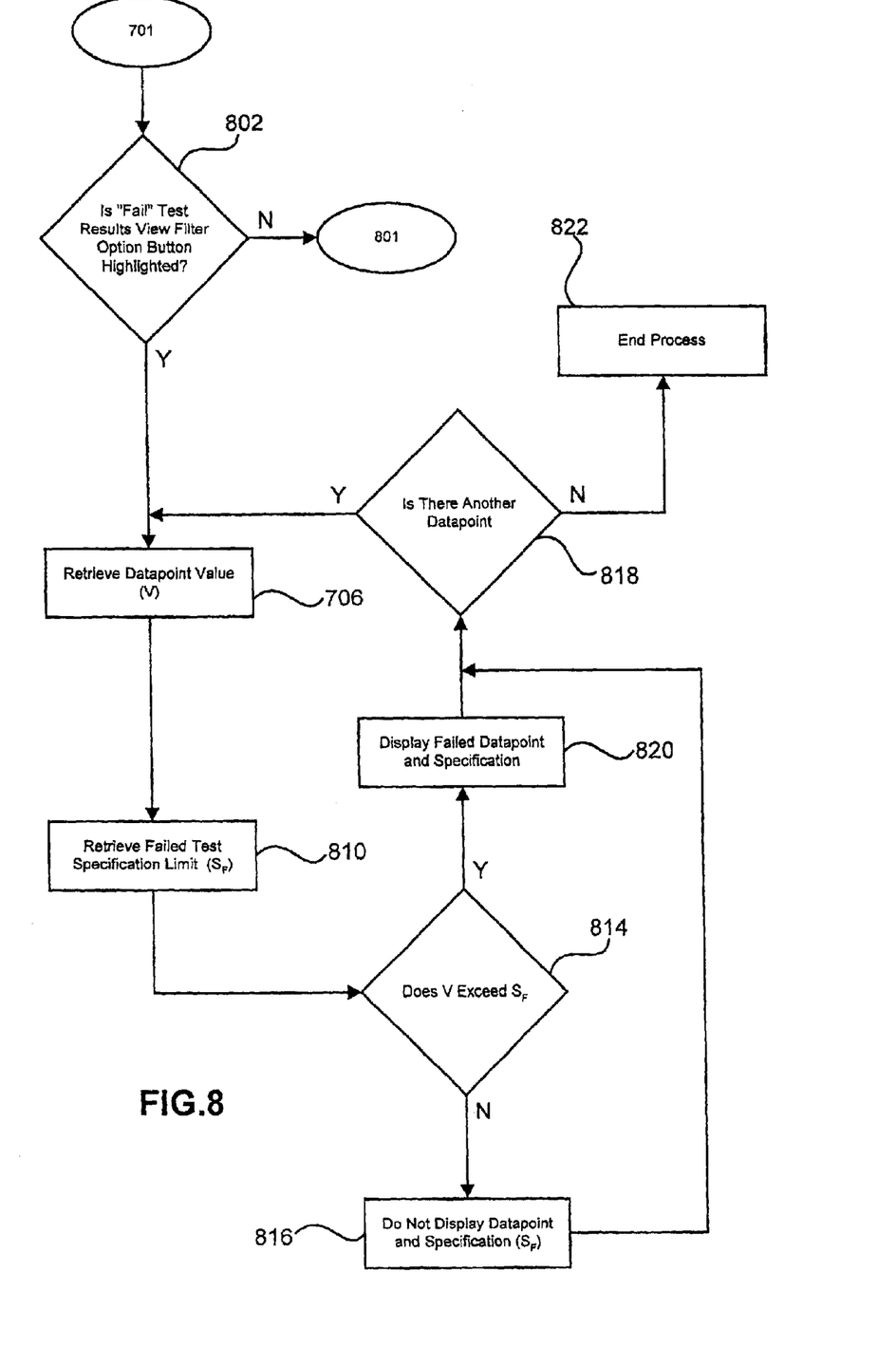
FIG. 8 is a flow diagram illustrating the determination of the failed test results view filter.

FIG. 8 illustrates a process to filter and display datapoint values 352 and datapoint value status 344 in response to the failed test results view filter option button 336 being selected. Step 701 starts this process into an initial inquiry 802 as to whether the failed test results view filter option button 336 has been selected; if it hasn't, then the process proceeds to step 801, described below. The test executive program retrieves 706 the datapoint value 352. Then step 810 retrieves the failed test specification limit 354. Step 814 compares the datapoint value 352 against the failed test specification limit 354 to determine whether the datapoint value 352 exceeds the failed test specification limit 354. If the datapoint value 352 does not exceed the failed test specification limit 354, then the datapoint value 352 will not be displayed 816 to the output device 116. If the datapoint value 352 does exceed the failed test specification limit 354, then the datapoint value 352 is displayed to the output device 116. Step 818 inquires whether there is another datapoint 350 to retrieve. If there is not another datapoint 350, then the process is ended 722.

Figure 9:
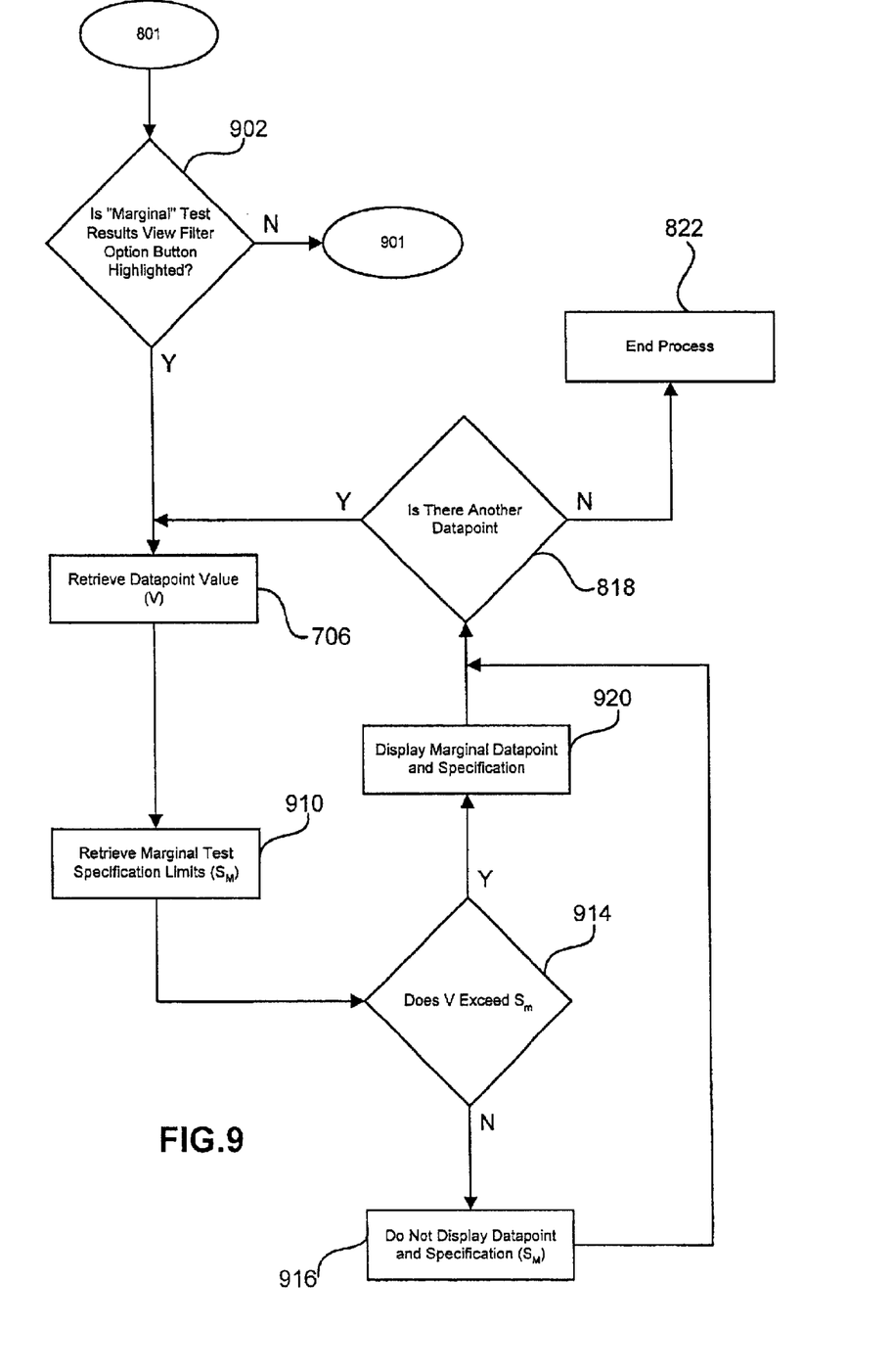
FIG. 9 is a flow diagram illustrating the determination of the marginal test results view filter.

FIG. 9 illustrates a process to filter and display datapoint values 352 and datapoint value status 344 in response to the marginal test results view filter option button 334 being selected. Step 801 starts this process into an initial inquiry 902 as to whether the marginal test results view filter option button 334 has been selected; if it hasn't, then the process proceeds to step 901, described below. The test executive program retrieves 706 the datapoint value 352. Then step 910 retrieves the marginal test specification limit 354. Step 914 compares the datapoint value 352 against the marginal test specification limit 354 to determine whether the datapoint value 352 exceeds the marginal specification limit 354. If the datapoint value 352 does not exceed the marginal test specification limit 354, then the datapoint value 352 will not be displayed 916 to the output device 116. If the datapoint value does exceed the failed test specification limit 354, then the datapoint value 708 is displayed. Step 818 inquires whether there is another datapoint 350 to retrieve; if there is not, then the process is ended 822.

Figure 10:
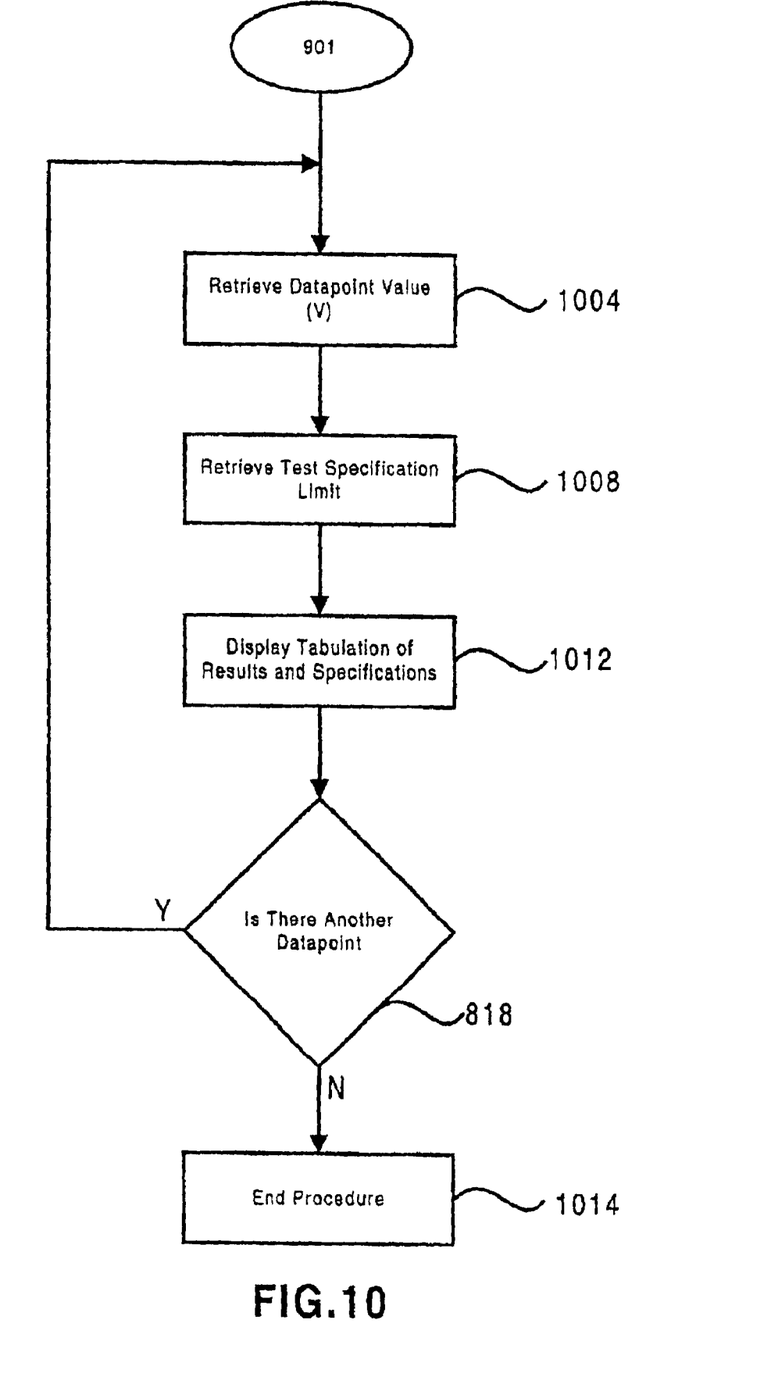
FIG. 10 shows a flow diagram illustrating the determination of the all test results view filter.

FIG. 10 illustrates a process to filter and display datapoint value 352 and datapoint value status 344 in response to the all test results view filter option button 332 being selected. The test executive program retrieves 1004 the datapoint value 352. Then step 1008 retrieves the test specification limit 354. The datapoint value 352 and the test specification limit 354 are displayed to the output device 1012. Step 818 inquires into whether there is another datapoint value 352 to retrieve; if there isn't, the process is ended 1014.

There has been described what at present is considered to be the preferred embodiment of the invention. It should be understood that the invention can be embodied in other specific forms without departing from its spirit or essential characteristics. For example, while the invention has been described in terms of an electronic test program, other systems may be implemented based on hardware instead of software. The program may, for instance, sit on a programmed processor or other platform. In addition, any number of test specification limits may be added to the graphical user interface to display the datapoint value status. The test results view filter may be displayed in other forms where the graphical elements may take a different form, such as a single alphanumeric element, and may be grouped in a different manner, be part of a pull down menu, or be switches or buttons on a computer console or video console. The present embodiment is, therefore, to be considered as illustrative and not restrictive. Those skilled in the art will recognize that alternate systems may be designed that infringe this invention as set forth in the claims below either literally or through the Doctrine of Equivalents.

We claim:

1. An electronic test system comprising:
  a memory for storing a test, a measurement, a datapoint, a datapoint value, and a datapoint value status associated with each said datapoint value indicating whether said datapoint value is a passed, marginal, or failed datapoint value;
  an electronic processor communicating with said memory for controlling the execution of said test;
  an input device communicating with said electronic processor for selecting between at least two of the following groups of said datapoint value status: all datapoint values, marginal datapoint values, failed datapoint values, or a selected datapoint value, wherein said input device communicates with said electronic processor to select datapoint value and said associated datapoint value status during one or more of before the test is executed, while the test is progressing and after the test has been completed; and
  an output device communicating with said electronic processor for displaying said selected datapoint value and said associated datapoint value status.

2. An electronic test system as in claim 1 wherein said memory further stores a test results view filter responsive to receiving from said input device.

3. An electronic test system as in claim 1 wherein said output device further displays said test results view filter.

4. An electronic test system as in claim 2 wherein said test results view filter further comprises a plurality of test results view filter option buttons.

5. An electronic test system as in claim 4 wherein said test results view option buttons are selected from the group consisting of: all, marginal, failed and selected.

6. An electronic test system as in claim 3 wherein said test results view option button further is highlighted or depressed when selected.

7. An electronic test system as in claim 1 wherein selected said all test results view option button displays to said output device said all datapoint values and said datapoint value status associated with said all datapoint values.

8. An electronic test system as in claim 1 wherein selected said marginal test results view option button displays to said output device said marginal datapoint values, said failed datapoint values, and said datapoint value status associated with said marginal datapoint values and said failed datapoint values.

9. An electronic test system as in claim 1 wherein selected said failed test results view option button displays to said output device said failed datapoint values and said datapoint value status associated with said failed datapoint values.

10. An electronic test system as in claim 1 wherein said input device is selected from the group consisting of: keys of a keyboard, an optical pointer, a knob, a spin control, a mouse, a joy stick, a touch pad, a button and a roller ball.

11. An electronic test system as in claim 1 wherein said test further comprises a test specification limit.

12. An electronic test system as in claim 11 wherein said memory further stores said test specification limit.

13. An electronic test system as in claim 11 wherein said test specification limit comprises a test specification limit selected from the group comprising an upper test specification limit and a lower test specification limit.

14. An electronic test system as in claim 11 wherein said datapoint value is compared to a said test specification limit and a resultant said datapoint value status is associated to said datapoint value.

15. An electronic test system as in claim 1 wherein said output device displays said test, said measurement, said datapoint, said datapoint value, said test specification limit, and said datapoint value status.

16. A method for displaying the datapoint values of an electronic test comprising the steps of:
  performing a test procedure to determine a plurality of datapoint values;
  storing said datapoint values and a test specification limit;
  comparing said datapoint values to said test specification limit;
  providing a resultant datapoint value status to each of said datapoint values;
  providing a test results view filter showing two or more of the following test results view filter option buttons: an all button, a marginal button, a failed button, and a selected button;
  selecting a test results view filter option button of the test results view filter, wherein said test results view filter is operable to filter said datapoint values and said associated datapoint value statuses during one or more of while the test procedure is progressing and after the test procedure has been completed; and
  displaying said datapoint values and associated datapoint value status corresponding to said selected test results view filter option button.

17. A method as in claim 16, further including the step of storing a datapoint value and a test specification limit for each of said datapoint values.

18. A method as in claim 16 wherein said test specification limit comprises a failed test specification limit.

19. A method as in claim 16 wherein said test specification limit comprises a marginal test specification limit.

20. A method as in claim 16 wherein said step of displaying further comprises displaying said test specification limit.

21. A method as in claim 18 wherein said step of comparing further comprises the step of comparing each said datapoint value with said failed test specification limit.

22. A method as in claim 19 wherein said step of comparing further comprises the step of comparing each said datapoint value with said marginal test specification limit.

23. A method as in claim 21 further including the step of providing a failed datapoint value status to said datapoint value where said datapoint value exceeds said failed test specification limit.

24. A method as in claim 22 further including the step of providing a marginal datapoint value status to said datapoint value where said datapoint value exceeds said marginal test specification limit.

25. A method as in claim 16 wherein said step of displaying further comprises displaying said datapoint value status.

26. A product for displaying datapoint values of an electronic test comprising instructions for directing a processing unit to:

perform a test procedure to determine a plurality of datapoint values;

store said datapoint values and a test specification limit;

compare said datapoint values to said test specification limit;

provide a resultant datapoint value status to each of said datapoint values;

provide a test results view filter showing two or more of the following test results view filter option buttons: an all button, a marginal button, a failed button, and a selected button;

select a test results view filter option button of the test results view filter wherein said test results view filter is operable to filter said datapoint values and said associated datapoint value statuses during one or more of while the test is progressing and after the test has been completed;

display said datapoint values and associated datapoint value status corresponding to said selected test results view filter option button; and a media readable by said processing unit that stores said instructions.

27. The product of claim 26 wherein said instructions for directing a processing unit to store said datapoint values and a test specification limit comprise:

instructions for storing a datapoint value and a test specification limit for each of said datapoint values.

28. The product of claim 26 wherein said test specification limit further comprises a failed test specification limit.

29. The product of claim 26 wherein said test specification limit further comprises a marginal test specification limit.

30. The product of claim 26 wherein said instructions for directing a processing unit to display said datapoint values comprise:

instructions for displaying said test specification limit.

31. The product of claim 28 wherein said instructions for directing a processing unit to compare said datapoint values to said test specification limit comprises:

instructions for comparing each said datapoint value with said failed test specification limit.

32. The product of claim 29 wherein said instructions for directing a processing unit to compare said datapoint values to said test specification limit comprises:

instructions for comparing each said datapoint value with said marginal test specification limit.

33. The product of claim 31 wherein said instructions for directing a processing unit to compare said datapoint values to said test specification limit comprises:

instructions for providing a failed datapoint value status to said datapoint value where said datapoint value exceeds said failed test specification.

34. The product of claim 32 wherein said instructions for directing a processing unit to compare said datapoint values to said test specification limit comprises:

instructions for providing a marginal datapoint value status to said datapoint value where said datapoint value exceeds said marginal test specification.

35. The product of claim 26 wherein said instruction for directing a processing unit to display said datapoint values comprises:

instructions for displaying said datapoint value status.

* * * * *